United States Patent [19]
Schulz

[11] Patent Number: 5,880,538
[45] Date of Patent: Mar. 9, 1999

[54] CAPACITIVE PROXIMITY SWITCH CIRCUIT

[75] Inventor: Jörg Schulz, Meckenbeuren, Germany

[73] Assignee: i f m electronic GmbH

[21] Appl. No.: 859,322

[22] Filed: May 20, 1997

[30] Foreign Application Priority Data

May 20, 1996 [DE] Germany .................. 196 20 059.8

[51] Int. Cl.⁶ .................................................. H02M 3/06
[52] U.S. Cl. .......................................... 307/109; 327/517
[58] Field of Search .................................. 307/109, 116; 327/517; 361/179, 181; 340/407.1, 407.2

[56] References Cited

U.S. PATENT DOCUMENTS

| 5,394,292 | 2/1995 | Hayashida ........................ 361/179 |
| 5,463,333 | 10/1995 | Calder et al. ...................... 327/517 |

FOREIGN PATENT DOCUMENTS

| 0 175 362 | 3/1986 | European Pat. Off. . |
| 15 66 733 | 11/1969 | Germany . |
| 90 05 912 U | 10/1990 | Germany . |
| 44 35 894 | 4/1996 | Germany . |

OTHER PUBLICATIONS

Smart Card –Abschied vom Autoschlüssel, Ulrich Schrey et al., Siemens Leitschrift Jan./Feb. 1996, pp. 32–35.

Primary Examiner—Richard T. Elms
Attorney, Agent, or Firm—Sixbey, Friedman, Leedom & Ferguson; David S. Safran

[57] ABSTRACT

A capacitive proximity switch which may be used as an actuating device for a variety of control applications, such as windshield wipers and door locks. According to the invention, the actuating element a contact or proximity switch to be actuated in a nonmechanical manner, and a sensor provided on an object being made as part of a capacitive proximity switch, specifically as an operating electrode of the capacitive proximity switch.

10 Claims, 2 Drawing Sheets

CAPACITIVE PROXIMITY SWITCH CIRCUIT

BACKGROUND OF THE INVENTION

1. Field of the Invention

The present invention relates to switching devices and more particularly, to a capacitive proximity switch circuit which may be used as an actuating device for a variety of universal control applications, such as windshield wiper and door lock control.

2. Description of Related Art

Switching devices have a myriad of applications in the emerging technologies of today. One example, is the use of switching devices in the automotive industry for windshield wiper or door lock control. The switching devices may be activated by a detection device that is used to detect a predetermined condition that, when satisfied, causes the switching mechanism to operate. One example of this is found in European Patent Application No. 0 175 362 to Okushima which discloses a capacitive-type detection device for detecting water on a windshield to control windshield wiper systems employed on vehicles, vessels or aircraft.

Traditionally, a vehicle owner's options with regard to locking and unlocking or releasing or securing and opening his vehicle were restricted to a mechanical key. Using radio remote control, infrared remote control, alternating code process and smart card systems for locking and unlocking doors soon evolved but required an additional actuation element for actuating the unlocking and locking mechanisms. These additional actuating elements are therefore provided especially in order that the corresponding door lock of a corresponding motor vehicle is capable of being unlocked by an electronic activation circuit. The response of the electronic activation circuit, however, should not lead easily to the unlocking or locking of the door. This is especially desirable in the smart card system (and in other so-called transponder systems).

Using the teaching of this invention an especially user-friendly circuit of the type under discussion will be devised.

SUMMARY OF THE INVENTION

The actuating element according to the invention is made as a capacitive proximity switch. A sensor element integrated into or provided on an object, such as a door handle, is made as an operating electrode of the capacitive proximity switch. Present-day miniaturization of electronic circuits also makes it possible to provide the capacitive proximity switch entirely, i.e., optionally except for the operating electrode, within an object.

Capacitive proximity switches operate when the capacitance between the operating electrode and a reference electrode reaches or exceeds a certain value, specifically by the operating body approaching an operating electrode, the operating body, for its part, being conductively or capacitively connected to the reference electrode. Often the frame or ground potential is used as the reference electrode.

If, in the circuit according to the invention, the actuating element is made as a capacitive proximity switch and if its operating electrode is integrated into or provided on an object, such as a door handle, external effects may lead to the capacitive proximity switch operating unintentionally, for example by rain, snow and ice allowing the capacitance between the operating electrode and the reference electrode to become large enough. Consequently, another teaching of the invention which is especially important is that the capacitive proximity switch is made such that it only switches when the capacitance between the operating electrode and the reference electrode changes at a rate which is greater than a lower boundary value. In other words, the capacitive proximity switch to be used here is a so-called dynamic capacitive proximity switch. If the capacitance between the operating electrode and the reference electrode changes at a rate which is less than a lower boundary value, the proximity switch does not switch, not even when the capacitance between the operating electrode and the reference electrode reaches a relatively high value.

Normally, a capacitive proximity switch made, for example, as a make contact, becomes conductive as soon as an operating body approaching the operating electrode allows the capacitance between the operating electrode and the reference electrode to become large enough, while the proximity switch then becomes nonconductive again when, by removing the operating body from the operating electrode, the capacitance between the operating electrode and the reference electrode again falls below the stipulated threshold value. This normal mode of operation of a capacitive proximity switch can be undesirable in the circuit according to the invention. Accordingly, another teaching of the invention is that the capacitive proximity switch only switches when the operating body approaches the operating electrode, and therefore, does not change its switching state when the operating body moves away from the operating electrode.

In particular, there are now various possibilities for embodying and developing the teaching of the invention when the actuating element is made as a capacitive proximity switch.

DETAILED DESCRIPTION OF PREFERRED EMBODIMENTS

The capacitive proximity switch circuit according to the invention may be used for a variety of control system applications. For purposes of describing the operation of the invention, the capacitive proximity switch is discussed in relation to unlocking or releasing at least one door lock (not shown) of a motor vehicle (likewise not shown). One of ordinary skill in the art, however, should appreciate that the invention is not limited to this application.

The present invention is a capacitive proximity switch circuit which may be used in an electronic activation circuit which is not shown. This activation circuit can be built and can operate according to a so-called smart card system or some other transponder system. In addition to the electronic activation circuit not shown, the circuit according to the invention also includes an actuation element. For example, the unlocking mechanism of the door lock can have an electromagnet which unlocks the door lock when a large enough current flows through it. Then the circuit, described in simple terms, can consist of a series connection of a voltage source, the unlocking magnet, the switch of the electronic activation circuit, with the switch executed as a make contact, and the electronic switch of the actuating element, with the latter switch likewise executed as a make contact. Only when both the switch of the electronic activation circuit and also the electronic circuit of the actuating element are conductive does a current which causes unlocking flow through the electromagnet.

Figure 1:
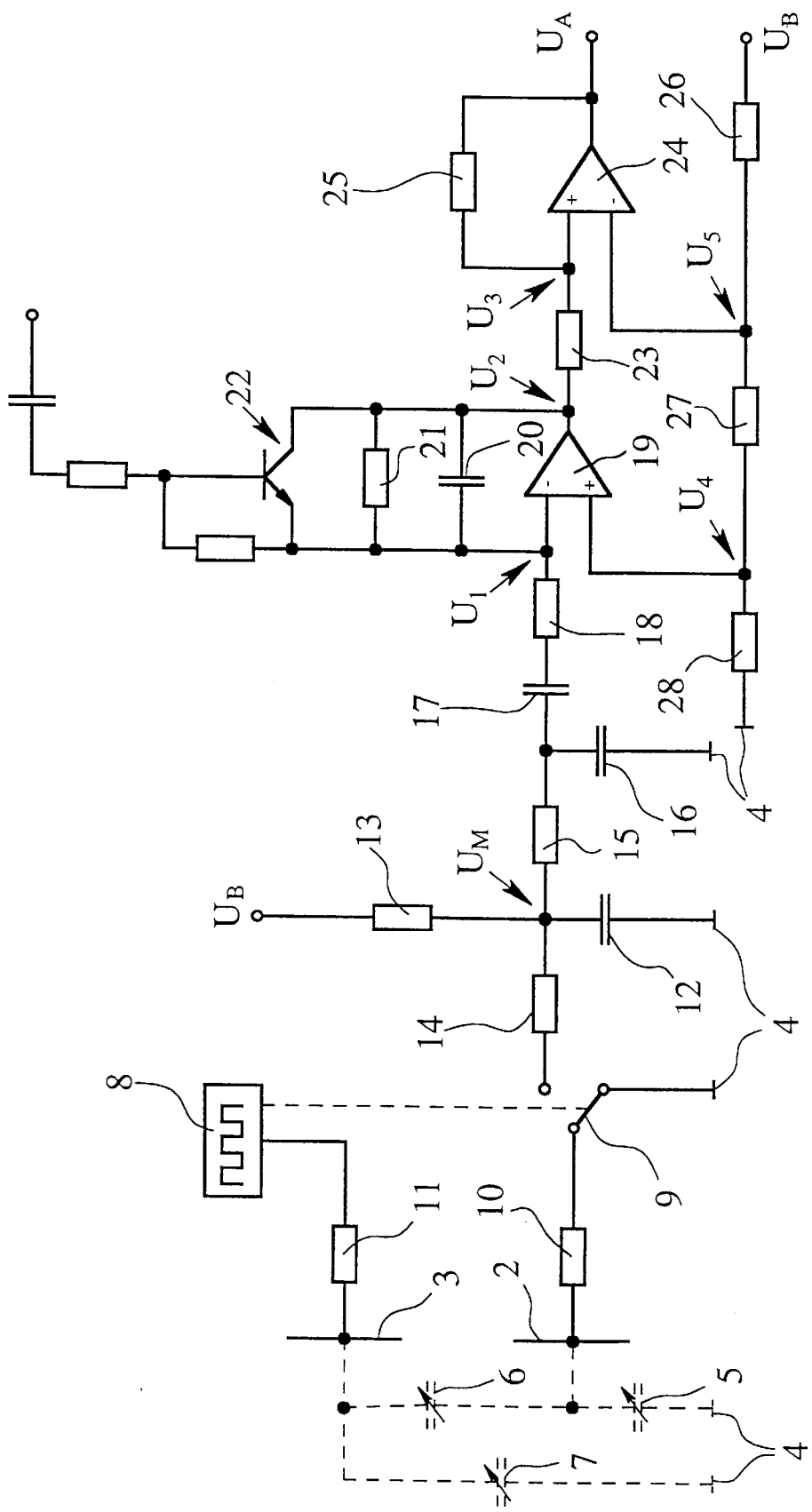
FIG. 1 is a schematic diagram of a capacitive proximity switch used as an actuating element in accordance with a preferred embodiment of the present invention.

According to the invention, the actuating element described above with respect to its operation is made as a contact or proximity switch to be actuated by nonmechanical means, preferably a sensor element integrated into or provided on an object, such as a door handle, which makes up part of the proximity switch circuit. It applies to the embodiment shown throughout in the figures that the actuating element is made as a capacitive proximity switch and that the sensor element is made as operating electrode 2 of the capacitive proximity switch. Preferably, as is not shown in the figures, the capacitive proximity switch is entirely, except for operating electrode 2, within the door handle (not shown). As FIG. 1 shows, in addition to operating electrode 2, another compensation electrode 3 is implemented. It is shown in FIG. 1 that between operating electrode 2, compensation electrode 3 and the reference electrode, here frame potential 4, capacitances are active, especially capacitance 5 between operating electrode 2 and frame potential 4, capacitance 6 between operating electrode 2 and compensation electrode 3 and capacitance 7 between compensation electrode 3 and frame potential 4; capacitance 5 is the capacitance which causes the capacitive proximity switch to switch when it changes with a rate which is greater than a lower boundary value. Otherwise it applies to the embodiment of the capacitive proximity switch shown in FIG. 1 that it only switches when an operating body, such as the hand of the individual who intends to unlock the corresponding door lock of the corresponding motor vehicle, approaches operating electrode 2. The capacitive proximity switch therefore does not change its switching state when the operating body, therefore the hand of the individual who has unlocked the door lock beforehand, is removed from operating electrode 2.

The capacitive proximity switch shown in FIG. 1 includes operating electrode 2, compensation electrode 3, clock generator 8 and changeover contact 9 controlled by clock generator 8. Operating electrode 2 is connected via coupling resistor 10 to the input of changeover contact 9, while compensation electrode 3 is connected via coupling resistor 11 to clock generator 8. The capacitive proximity switch shown also includes a storage capacitance 12 as well as charging resistor 13 and discharging resistor 14. Charging resistor 13, on the one hand, is connected to power supply voltage $U_B$, and on the other hand, to storage capacitance 12 which is connected on its other end to frame potential 4. Discharge resistor 14 is connected on the one hand to storage capacitance 12 and charging resistor 13, on the other to one output of changeover contact 9. The other output of changeover contact 9 is connected to frame potential 4. A low pass filter consisting of lowpass resistor 15 and lowpass capacitance 16 is connected to the connection of storage capacitance 12 and charging resistor 13. A differential amplifier consisting of input capacitance 17, input resistor 18, operational amplifier 19, feedback capacitance 20 and feedback resistor 21 is connected to the low pass filter, specifically to the connection of the lowpass resistor 15 to the lowpass capacitance 16. In this embodiment, parallel to the feedback capacitance 20 and feedback resistor 21 is another electronic switch 22 which is used to suppress interference signals. Connected downstream of the differential amplifier is a comparator with input resistor 23, operational amplifier 24 and feedback resistor 25. Finally, there is a voltage divider which consists of three voltage divider resistors 26, 27 and 28 and which is connected, on the one hand, to power supply voltage $U_B$, and on the other, to frame potential 4. The noninverting input of operational amplifier 19 which belongs to the differential amplifier is connected to the connection of two voltage divider resistors 27 and 28, the inverting input of operational amplifier 24 which belongs to the comparator is connected to the connection of two voltage divider resistors 26 and 27. Finally, it is shown in FIG. 1 at which locations certain potentials lie; their behavior over time is shown in FIGS. 2a–2e, specifically potentials $U_M$, $U_1$, $U_2$, $U_3$, $U_4$, $U_5$, and $U_A$.

The differential amplifier consisting of input capacitance 17, input resistor 18, operational amplifier 19, feedback capacitance 20 and feedback resistor 21 must have bandpass behavior. The lower cutoff frequency is determined by input capacitance 17 and feedback resistor 21 and should be in the range of 0.2–1 Hz, preferably, roughly 0.5 Hz, while the upper cutoff frequency should be roughly 30–70 Hz, preferably, roughly 50 Hz. The greater the time constant formed by input capacitance 17 and feedback resistor 21, the greater the voltage range, i.e., potential $U_2$ at the output of the differential amplifier and at the output of operational amplifier 19. It is possible to choose either a large value for input capacitance 17 and a small value for feedback resistor 21 or a small value for input capacitance 17 and a large value for feedback resistor 21. If an overly large value is chosen for input capacitance 17 or if an overly large value is chosen for feedback resistor 21, deleterious leakage currents can occur. Otherwise, the time constant which is formed by input capacitance 17 and feedback resistor 21 forms the lower boundary value of the rate with which capacitance 5 must change between operating electrode 2 and the reference electrode, therefore ground potential 4, for the capacitive proximity switch to operate. Feedback capacitance 20 determines the upper cutoff frequency of the differential amplifier. In one possible embodiment, without feedback capacitance 20, any smaller noise signal of higher frequency would lead to operation of the proximity switch.

Figure 2A:
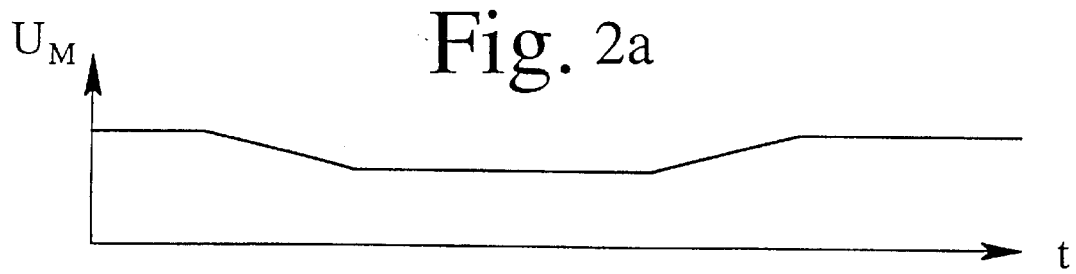
FIGS. 2a–2e are is a graphical representation of potential, across predetermined nodes of the capacitive proximity switch circuit illustrated in FIG. 1, versus time.
Figure 2B:
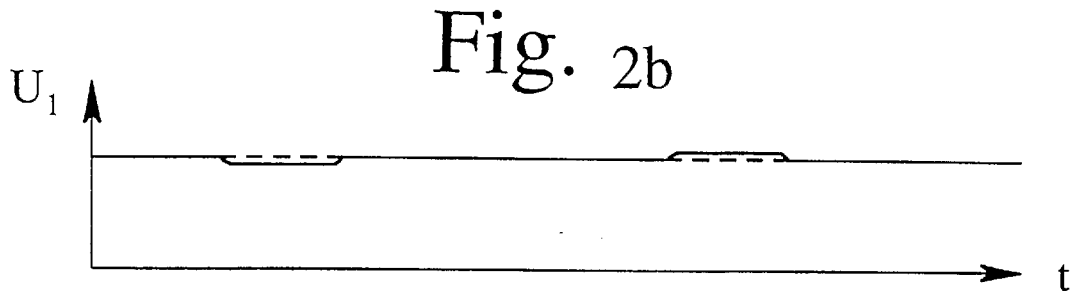
Figure 2C:
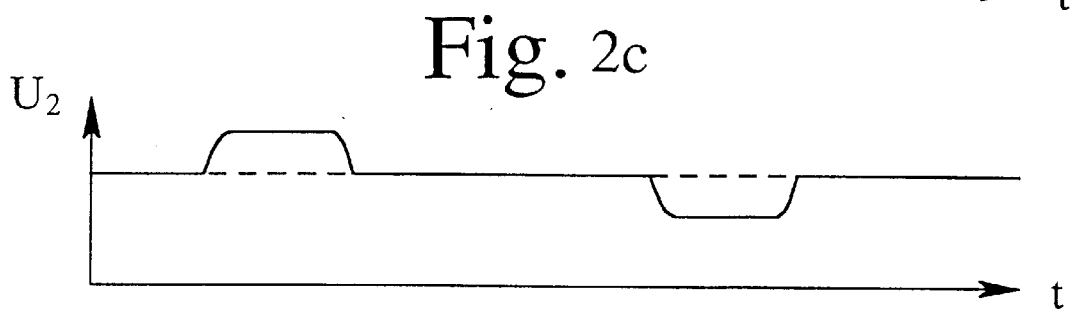
Figure 2D:
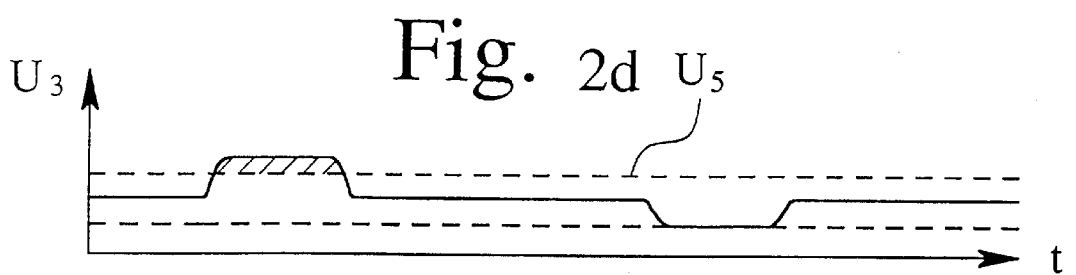

FIG. 2a shows, first of all, the behavior of potential $U_M$ over time. Upon approaching operating electrode 2, potential $U_M$ drops, and when moving away, it rises again. Potentials $U_1$ and $U_2$ (FIGS. 2b and 2c) are influenced by decreasing potential $U_M$ or by rising potential $U_M$. The behavior of potential $U_3$ (FIG. 2d) over time corresponds to the behavior of potentials $U_1$ and $U_2$ over time.

Figure 2E:
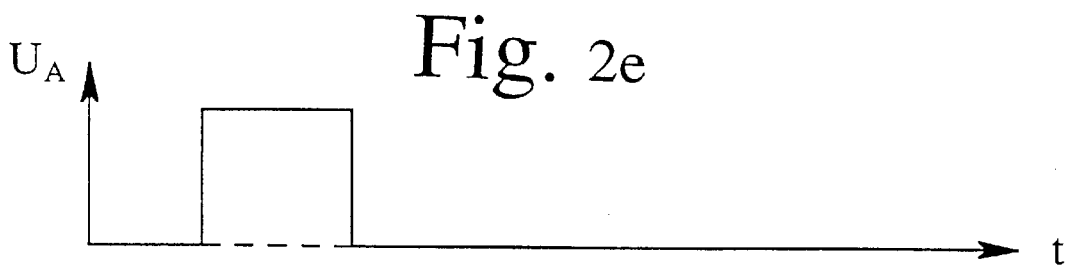

FIG. 2e shows potential $U_A$, therefore the output signal. Only when potential $U_3$ is greater than constant potential $U_5$ is there positive potential $U_A$ at the output of the comparator, therefore at the output of the operational amplifier. As seen by the foregoing disclosure, the capacitive proximity switch circuit provides an effective switching device for universal control systems. When used in a locking control system, the capacitive proximity switch circuit is activated, thereby locking or unlocking a door, when a user's hand approaches the operating electrode of the circuit. One important feature of the invention is that the switching state of the circuit is unchanged when the user removes her hand from the vicinity of the operating electrode. The capacitive proximity switch circuit may also be used for windshield wiper control. In this environment, the circuit may be activated when a sufficient amount of water approaches the operating electrode, thus, causing the circuit to change switching states and initiating operation of the wipers.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

What is claimed is:

1. A capacitive proximity switch circuit, comprising:
   a reference electrode;
   an operating electrode;
   a changeover contact having an input electrically connected to said operating electrode, said changeover contact being controlled by a clock generator and having a first and second output, the second output of said changeover contact being connected to a frame potential; and
   a storage capacitance electrically connected via a charging resistor connected to a power supply voltage and via a discharging resistor to a first output of said changeover contact, said storage capacitance being further connected to said frame potential;
   wherein the circuit switches only when the capacitance between said operating electrode and said reference electrode changes at a rate which is greater than a stipulated lower boundary value.

2. The switch circuit of claim 1, wherein the circuit switches only when an operating body approaches said operating electrode.

3. The switch circuit of claim 1, wherein a low pass filter comprising a lowpass resistor and a lowpass capacitance is connected to the connection of said storage capacitance, said charging resistor, and said discharging resistor.

4. The switch circuit of claim 1, further comprising a differential amplifier connected to the connection of said storage capacitance, said charging resistor and said discharging resistor.

5. The switch circuit of claim 3, further comprising a differential amplifier connected to the connection of said lowpass resistor and said lowpass capacitance.

6. The switch circuit of claim 5, wherein said differential amplifier consists of an input capacitance, a first input resistor, a first operational amplifier, a feedback capacitance and a first feedback resistor, wherein a series connection of said input capacitance and said first input resistor is connected to an inverting input of said first operational amplifier, and wherein the parallel connection of said feedback capacitance and said first feedback resistor is connected to an output of said first operational amplifier and to said inverting input of said first operational amplifier.

7. The switch circuit of claim 6, further comprising an electronic switch for noise signal suppression connected in parallel to the parallel connection of said feedback capacitance and said first feedback resistor.

8. The switch circuit of claim 6, further comprising a comparator connected to the output of said differential amplifier.

9. The switch circuit of claim 8, wherein said comparator consists of a second input resistor, a second operational amplifier and a second feedback resistor, wherein said second input resistor is connected to a noninverting input of said second operational amplifier, and wherein said second feedback resistor is connected to an output of said second operational amplifier and a noninverting input of said second operational amplifier.

10. The switch circuit of claim 9, further comprising a voltage divider consisting of a first voltage divider resistor, a second voltage divider resistor and a third voltage divider resistor, wherein said voltage divider is connected to a power supply voltage and a frame potential, and wherein a noninverting input of said first operational amplifier of said differential amplifier is connected to a first voltage divider tap, which is the connection of said second and third voltage divider resistors, and an inverting input of said second operational amplifier of said comparator is connected to a second voltage tap, which is the connection of said first and second voltage divider resistors.

* * * * *